(12) United States Patent
Osawa et al.

(10) Patent No.: US 7,982,232 B2
(45) Date of Patent: Jul. 19, 2011

(54) SEMICONDUCTOR LIGHT-EMITTING DEVICE, MANUFACTURING METHOD THEREOF, AND LAMP

(75) Inventors: Hiroshi Osawa, Chiba (JP); Naoki Fukunaga, Munakata (JP); Hironao Shinohara, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/199,767

(22) Filed: Aug. 27, 2008

(65) Prior Publication Data

US 2010/0051981 A1 Mar. 4, 2010

(51) Int. Cl.
*H01L 33/00* (2010.01)

(52) U.S. Cl. ............ 257/98; 257/E33.074; 438/29

(58) Field of Classification Search ........ 257/98
See application file for complete search history.

(56) References Cited

U.S. PATENT DOCUMENTS

| 7,042,089 B2 | 5/2006 | Uemura et al. |
| 2006/0267042 A1* | 11/2006 | Izuno et al. ............ 257/100 |
| 2008/0308833 A1* | 12/2008 | Moriyama et al. ........ 257/99 |
| 2009/0001407 A1 | 1/2009 | Osawa et al. |
| 2009/0008672 A1 | 1/2009 | Osawa et al. |

FOREIGN PATENT DOCUMENTS

| JP | 6-291368 A | 10/1994 |
| JP | 10-31434 A | 2/1998 |
| JP | 10-190056 A | 7/1998 |
| JP | 2000-196152 A | 7/2000 |
| JP | 2002-353499 A | 12/2002 |
| JP | 2004-55692 A | 2/2004 |
| JP | 2005-11737 A | 1/2005 |
| JP | 2005-72527 A | 3/2005 |
| JP | 2005-197687 A | 7/2005 |
| JP | 2005-277295 A | 10/2005 |
| JP | 2007-220970 A | 8/2007 |
| JP | 2007-220972 A | 8/2007 |

OTHER PUBLICATIONS

Yutaka Furubayashi, et al.; "A Transparent Metal: Nb-doped anatase $TiO_2$"; Applied Physics Letters 86, 252101 (2005); Jun. 20, 2005; pp. 252101-252103.
Final Office Action dated Nov. 22, 2010 issued in U.S. Appl. No. 12/199,764.
Non-Final Office Action dated Aug. 25, 2010, issued in U.S. Appl. No. 12/199,746.

* cited by examiner

*Primary Examiner* — Jarrett J Stark
*Assistant Examiner* — Lawrence Tynes, Jr.
(74) *Attorney, Agent, or Firm* — Sughrue Mion, PLLC

(57) ABSTRACT

There is provided a semiconductor light-emitting device having excellent light extraction efficiency and low wavelength unevenness, a manufacturing method thereof, and a lamp. A semiconductor light-emitting device includes an n-type semiconductor layer 12, a light-emitting layer 13, a p-type semiconductor layer 14, and a titanium oxide-based conductive film layer 15 laminated in this order, wherein a random concavo-convex surface 15 is formed on at least a part of the surface of the titanium oxide-based conductive film layer.

20 Claims, 5 Drawing Sheets

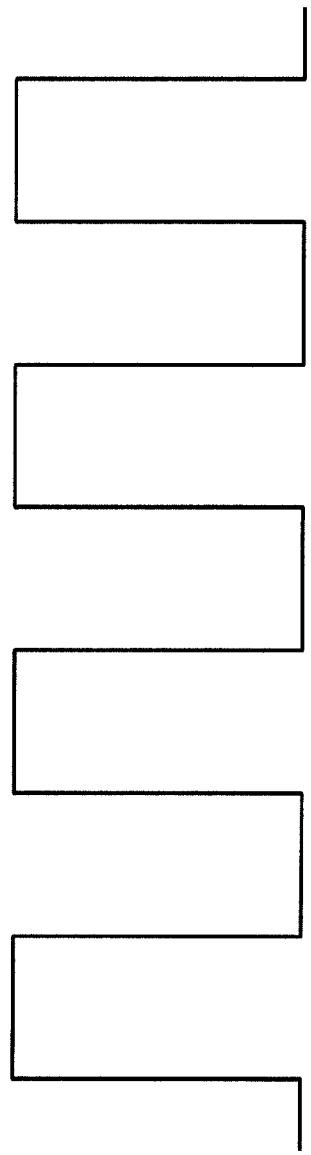
FIG. 4A  RECTANGULAR SHAPE
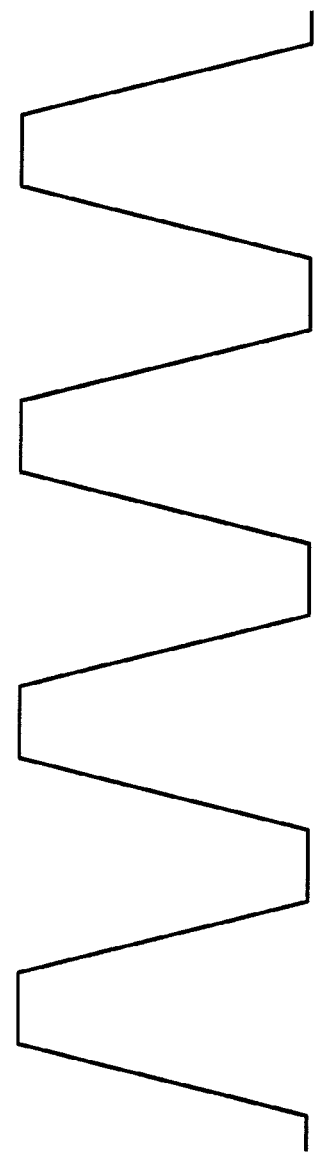
FIG. 4B  SLOPE SHAPE
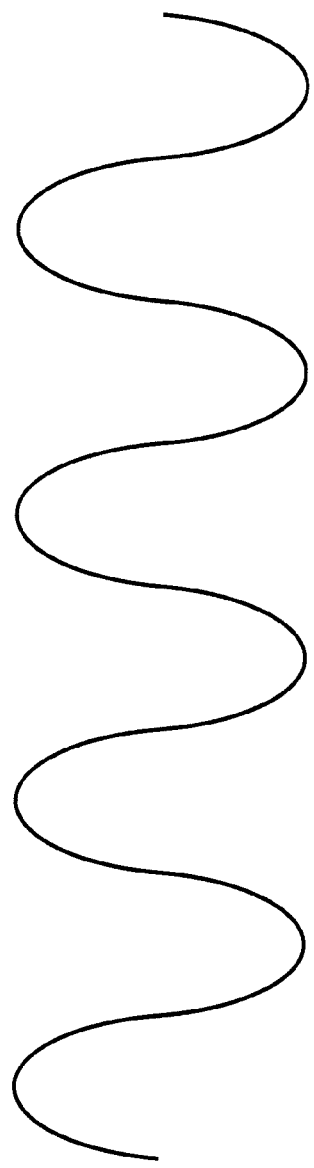
FIG. 4C  CURVED SHAPE

SEMICONDUCTOR LIGHT-EMITTING DEVICE, MANUFACTURING METHOD THEREOF, AND LAMP

BACKGROUND OF THE INVENTION

1. Field of the Invention

The present invention relates to a semiconductor light-emitting device, and particularly to a semiconductor light-emitting device having excellent light extraction efficiency, a manufacturing method thereof, and a lamp.

2. Description of Related Art

In recent years, gallium nitride (GaN)-based compound semiconductor materials, which are nitride-based semiconductors, have become of interest as a semiconductor material for producing a light-emitting device that emits light of short wavelength. A GaN-based compound semiconductor is grown on a substrate of sapphire single crystal, a variety of oxides, or a Group III-V compound, through a metal-organic chemical vapor deposition method (MOCVD method), a molecular-beam epitaxy method (MBE method), or the like.

As a structure of a general GaN-based compound semiconductor light-emitting device, if a sapphire single crystal substrate is employed, an n-type semiconductor layer, a light-emitting layer, and a p-type semiconductor layer are laminated in this order. Since the sapphire substrate is an insulator, the device structure generally has a structure as shown in FIG. 1 in which a positive electrode formed on the p-type semiconductor layer and a negative electrode formed on the n-type semiconductor layer are present in the same plane. Such a GaN-based compound semiconductor light-emitting device has two types: a face up type in which a transparent electrode is used as a positive electrode to extract light from the p-type semiconductor side; and a flip chip type in which a high reflective film of Ag or the like is used as a positive electrode to extract light from the sapphire substrate side.

For providing the transparent electrode on the p-type semiconductor, a metal transparent electrode made of Ni/Au or the like has been conventionally used. In recent years, however, in order to improve the light extraction efficiency of light-emitting devices, translucent conductive oxide films of ITO or the like have been practically and positively used at an industrial level.

External quantum efficiency is used as an index to improve the output from such a light-emitting device. It can be said that a higher external quantum efficiency means a light-emitting device with higher output.

The external quantum efficiency is represented as the multiplication of internal quantum efficiency and light extraction efficiency.

The internal quantum efficiency is the proportion of energy converted into light amongst energy of electrical current injected into the device. Meanwhile, the light extraction efficiency is the proportion of light that can be extracted to the outside amongst light generated inside the semiconductor crystal.

There are mainly two ways to improve the light extraction efficiency. The first is a method of reducing absorption of emission wavelength into an electrode, a protective film, or the like formed on the light extraction surface. The other is a method of reducing reflection loss occurring at an interface between materials having different refractive indexes, such as between a compound semiconductor, an electrode, and a protective film.

Here, one of the reasons why a metal transparent electrode of Ni/Au or the like has been replaced by a translucent conductive oxide film of ITO or the like, is that the absorption of the emission wavelength can be reduced by using the translucent conductive oxide film.

As the method of reducing reflection loss occurring at an interface between materials having different refractive indexes, there is a technique in which the light extraction surface is treated to form a concavo-convex surface. As the treatment method of forming the concavo-convex surface, there has been proposed a light-emitting device in which the compound semiconductor itself is treated to form a concavo-convex surface (for example, Patent Document 1).

However, in the light-emitting device described in Patent Document 1, since the semiconductor material is treated, the semiconductor layer is subjected to loading and is thus damaged. Therefore, although the light extraction efficiency is improved, the internal quantum efficiency is lowered, causing a problem in that the emission intensity can not be increased.

Likewise of the light-emitting device described in Patent Document 1, the light extraction efficiency of the light-emitting device can be improved by forming a concavo-convex surface on the translucent conductive oxide film. In this case, the translucent conductive oxide film undertakes a role as a light extraction layer in addition to its original role as a current diffusion layer.

However, since the refractive index of ITO is as small as 1.9, as compared to 2.6 for the GaN-based compound semiconductor, total reflection occurs at the interface between the ITO and the GaN-based compound semiconductor, which causes a problem of insufficient light extraction.

Titanium oxide has, although depending on its wavelength, a refractive index of 2.6 (wavelength 450 nm), which is approximately the same as that of the GaN-based compound semiconductor. Although titanium oxide is an insulator, it has been recently revealed to become conductive by adding Nb or the like (refer to Non-patent Document 1).

By using such conductive titanium oxide for a transparent electrode and by forming a concavo-convex surface on the titanium oxide rather than forming a concavo-convex surface on the GaN-based compound semiconductor, the light extraction efficiency of the light-emitting device can be readily improved.

However, when the roughening treatment such as a concavo-convex pattern is performed on the surface of a semiconductor layer, a fine mask patterning method is required. Therefore, complicated steps need to be performed in the treatment, which may cause concern of the reduction in the production yield.

In addition, the concavo-convex pattern formed by the mask patterning method causes the interference effect, and therefore, there was a problem of the amplification of light at a certain wavelength.

[Patent Document 1] Japanese Patent No. 2836687

[Non-patent Document 1] American Institute of Physics, "A Transparent metal: Nb-Doped anatase $TiO_2$", Applied Physics Letter 86, 252101 (2005) (US), 20 Jun. 2005, p 252101-252103

SUMMARY OF THE INVENTION

The present invention addresses the abovementioned problems with an object of providing a semiconductor light-emitting device having excellent light extraction efficiency and low wavelength unevenness, a manufacturing method thereof, and a lamp, by using titanium oxide for a transparent electrode.

To solve the above problems, the inventors of the present invention have conducted intensive studies. As a result, they have completed the present invention.

That is, the present invention relates to the following.

[1] A semiconductor light-emitting device comprising an n-type semiconductor layer, a light-emitting layer, a p-type semiconductor layer, and a titanium oxide-based conductive film layer laminated in this order, wherein a random concavo-convex surface is formed on at least a part of the surface of the titanium oxide-based conductive film layer.

[2] The semiconductor light-emitting device according to [1], wherein the mean distance between convex parts on the random concavo-convex surface formed on the surface of the titanium oxide-based conductive film layer, which is defined as the center-to-center distance between the convex parts, is within a range of 0.01 µm to 3 µm.

[3] The semiconductor light-emitting device according to [1], wherein the mean distance between convex parts on the random concavo-convex surface formed on the surface of the titanium oxide-based conductive film layer, which is defined as the center-to-center distance between the convex parts, is within a range of 0.05 µm to 1.5 µm.

[4] The semiconductor light-emitting device according to either one of [2] and [3], wherein the standard deviation of the center-to-center distance between the convex parts from the mean value of the center-to-center distance between the convex parts is within a range of 10% to 80%.

[5] The semiconductor light-emitting device according to any one of [1] through [4], wherein the titanium oxide-based conductive film layer is of an oxide comprising Ti and at least one element selected from the group consisting of Ta, Nb, V, Mo, W, and Sb.

[6] The semiconductor light-emitting device according to any one of [1] through [5], wherein the semiconductor light-emitting device is a nitride-based semiconductor light-emitting device.

[7] The semiconductor light-emitting device according to [6], wherein the nitride-based semiconductor light-emitting device is a GaN-based semiconductor light-emitting device.

[8] A method of manufacturing a semiconductor light-emitting device, comprising: a step (1) of laminating, on a substrate, an n-type semiconductor layer, a light-emitting layer, a p-type semiconductor layer, and a titanium oxide-based conductive film layer in this order; a step (2) of forming a mask made of fine metal particles on the surface of the titanium oxide-based conductive film layer; and a step (3) of etching the surface of the titanium oxide-based conductive film layer from above the mask.

[9] A method of manufacturing a semiconductor light-emitting device according to [8], wherein the step (2) comprises a step of forming a metal thin film on the surface of the titanium oxide-based conductive film layer and a heat treatment step following the formation of the metal thin film.

[10] A method of manufacturing a semiconductor light-emitting device according to either one of [8] and [9], wherein the step (3) forms, by dry etching, a concavo-convex surface on at least a part of the surface of the titanium oxide-based conductive film layer.

[11] A method of manufacturing a semiconductor light-emitting device according to either one of [8] and [9], wherein the step (3) forms, by wet etching, a concavo-convex surface on at least a part of the surface of the titanium oxide-based conductive film layer.

[12] A method of manufacturing a semiconductor light-emitting device according to any one of [8] through [11], wherein the fine metal particles forming the mask are Ni or Ni alloy.

[13] A method of manufacturing a semiconductor light-emitting device according to any one of [8] through [12], wherein the fine metal particles forming the mask are a low melting point metal or a low melting point alloy having a melting point within a range of 100° C. to 450° C.

[14] A method of manufacturing a semiconductor light-emitting device according to any one of [8] through [13], wherein the fine metal particles forming the mask are a low melting point metal selected from the group consisting of Ni, Au, Sn, Ge, Pb, Sb, Bi, Cd, and In, or a low melting point alloy containing at least one low melting point metal selected from the group.

[15] A lamp comprising the semiconductor light-emitting device according to any one of [1] through [7].

[16] A lamp comprising a semiconductor light-emitting device obtained by the manufacturing method according to any one of [8] through [14].

According to the semiconductor light-emitting device of the present invention, a semiconductor light-emitting device having excellent light extraction efficiency and low wavelength unevenness can be obtained by forming a random concavo-convex surface on at least a part of the surface of the titanium oxide-based conductive film layer.

When the semiconductor light-emitting device of the present invention is treated to be in a lamp shape, a light-harvesting property can be improved depending on the properties of a resin used in a lamp. Therefore, it is possible to obtain a lamp having a high light emission output.

Moreover, in the method of manufacturing a semiconductor light-emitting device of the present invention, the rough surface treatment that forms the concavo-convex surface provides the following effects (1) to (3).

(1) By forming the concavo-convex surface with a certain range of variation, the interference effect is suppressed, and a semiconductor light-emitting device having low wavelength unevenness can be produced.

(2) Because the concavo-convex surface is formed using a mask of fine metal particles, an advanced type of mask patterning step is unnecessary, and a roughening fine treatment area can be formed easily and inexpensively.

(3) Because the concavo-convex surface is formed on the titanium oxide-based conductive film layer, a semiconductor light-emitting device can be produced without damaging the semiconductor layer.

BRIEF DESCRIPTION OF THE DRAWINGS

FIG. 4A is a schematic diagram illustrating the light-emitting device of the present invention, showing an example of fragmentary cross-sectional structures of the light-emitting device shown in FIG. 2.

FIG. 4B is a schematic diagram illustrating the light-emitting device of the present invention, showing another example of fragmentary cross-sectional structures of the light-emitting device shown in FIG. 2.

FIG. 4C is a schematic diagram illustrating the light-emitting device of the present invention, showing another example of fragmentary cross-sectional structures of the light-emitting device shown in FIG. 2.

The reference symbols shown in these figures are defined as follows:

1 and 2 . . . Light-emitting device, 5 . . . Lamp, 11 and 21 . . . Substrate, 12 and 22 . . . N-type semiconductor layer, 13 and 23 . . . Light-emitting layer, 14 and 24 . . . P-type semiconductor layer, 15 and 25 . . . Titanium oxide-based conductive film layer, 16 and 26 . . . Photocatalytic reaction-prevention layer, 17 . . . Positive electrode, 18 . . . Negative electrode.

DETAILED DESCRIPTION OF THE INVENTION

Hereunder is a description of one embodiment of a semiconductor light-emitting device of the present invention and a lamp using the same, with reference to FIG. 1 to FIG. 5.

However, it should be noted that the present invention is not to be limited by any of the following embodiment. For example, components of the embodiment may be appropriately combined.

[Overall Structure of Semiconductor Light-Emitting Device]

Figure 1:
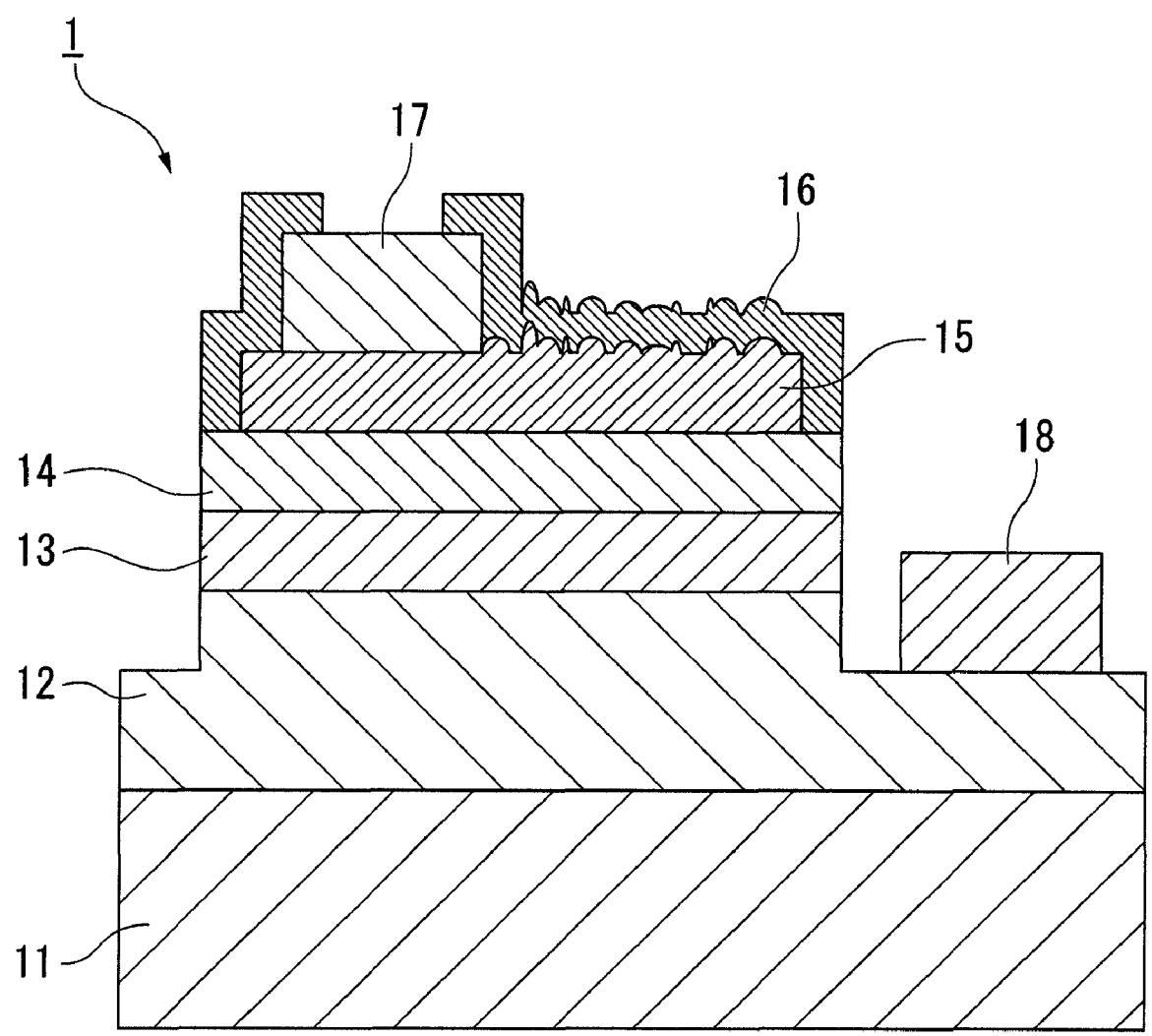
FIG. 1 is a schematic diagram illustrating an example of a light-emitting device of the present invention, showing a cross-sectional structure.

FIG. 1 is a schematic diagram showing a cross-section of the semiconductor light-emitting device of the present invention.

In FIG. 1, reference symbol 11 denotes a substrate, 12 denotes an n-type semiconductor layer, 13 denotes a light-emitting layer, 14 denotes a p-type semiconductor layer, 15 denotes a titanium oxide-based conductive film layer, 16 denotes a photocatalytic reaction-prevention layer, 17 denotes a positive electrode, and 18 denotes a negative electrode.

The semiconductor light-emitting device 1 of the present embodiment uses the titanium oxide-based conductive film layer 15 as a transparent electrode, and is schematically constituted as shown in FIG. 1, with a random concavo-convex surface formed on at least a part of the surface of the titanium oxide-based conductive film layer 15.

As an example shown in FIG. 1, the titanium oxide-based conductive film of the present invention is formed directly above the p-type semiconductor layer 14 or above the p-type semiconductor layer 14 through a metal layer that is not illustrated.

Also, the photocatalytic reaction-prevention layer of the present invention is formed directly above the titanium oxide-based conductive film 15 or above another layer (not illustrated) that is sandwiched between the film 15 and the layer 16, so as to cover the titanium oxide-based conductive film 15.

Hereunder is a detailed description of the semiconductor light-emitting device 1 of the present embodiment.

(Substrate)

The substrate 11 may be formed of a known substrate material, such as: oxide single crystals including sapphire single crystal ($Al_2O_3$; A-plane, C-plane, M-plane, or R-plane), spinel single crystal ($MgAl_2O_4$), ZnO single crystal, $LiAlO_2$ single crystal, $LiGaO_2$ single crystal, and MgO single crystal; Si single crystal; SiC single crystal; GaAs single crystal; AlN single crystal; GaN single crystal; and boride single crystals such as $ZrB_2$ single crystal.

In the present invention, any substrate material including these known substrate materials may be employed without limitation. Among these, sapphire single crystal and SiC single crystal are particularly preferred.

There is no particular limitation for the planar orientation of the substrate. Moreover, the substrate may be an on-axis substrate or an off-axis substrate.

(Nitride-Based Compound Semiconductor)

On the abovementioned substrate 11 are normally laminated the n-type semiconductor layer 12 composed of a nitride-based compound semiconductor, the light-emitting layer 13, and the p-type semiconductor layer 14, through buffer layers (not shown). Moreover, the buffer layer may be unnecessary depending on the substrate to be used and the growth condition of the epitaxial layer.

For the nitride-based compound semiconductor, a variety of nitride-based compound semiconductors such as those represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. The symbol M represents a Group V element other than nitrogen (N). $0 \leq A < 1$) are known. In the present invention, any gallium nitride-based compound semiconductor represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. The symbol M represents a Group V element other than nitrogen (N). $0 \leq A < 1$), including these known nitride-based compound semiconductors, may be employed without limitation.

The nitride-based compound semiconductor may contain another Group III element other than Al, Ga, and In, and may also contain, if necessary, an element such as Ge, Si, Mg, Ca, Zn, Be, P, As, and B. Furthermore, in some cases, such nitride-based compound semiconductor contains not only intentionally added elements, but also impurities inevitably contained depending on the film formation conditions, and the like, and trace amounts of impurities contained in raw materials and reaction tube materials.

There is no particular limitation on the method of growing the nitride-based compound semiconductor, and any method known to grow nitride semiconductor may be applied. Examples thereof include MOCVD (metal organic chemical vapor deposition), HVPE (hydride vapor phase epitaxy), and MBE (molecular beam epitaxy). MOCVD is preferably employed from the viewpoints of film thickness controllability and mass productivity.

In the case of the MOCVD method, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia ($NH_3$), hydrazine ($N_2H_4$), or the like is employed as an N (Group V element) source. In addition, for the n-type dopant, monosilane ($SiH_4$) or disilane ($Si_2H_6$) may be employed as an Si source, and an organic germanium compound such as germane gas ($GeH_4$), tetramethylgermanium (($CH_3)_4Ge$), or tetraethylgermanium (($C_2H_5)_4Ge$) may be employed as a Ge source.

In the case of the MBE method, elemental germanium may also be employed as a source of dopant. For example, for the p-type dopant, bis(cyclopentadienyl)magnesium ($Cp_2Mg$) or bis(ethylcyclopentadienyl)magnesium (($EtCp)_2Mg$) is employed as an Mg source.

The n-type semiconductor layer 12 is normally composed of an under layer, an n-contact layer, and an n-clad layer. The n-contact layer may also function as the under layer and/or the n-clad layer.

The under layer is preferably composed of an $Al_XGa_{1-X}N$ layer ($0 \leq x \leq 1$, preferably $0 \leq x \leq 0.5$, and more preferably $0 \leq x \leq 0.1$). The thickness of the under layer is preferably 0.1 μm or more, more preferably 0.5 μm or more, and most preferably 1 μm or more. By having the film thickness of 1 μm or more, the $Al_xGa_{1-x}N$ layer can be readily obtained with excellent crystallinity.

The under layer may be doped with an n-type impurity within a range of $1\times10^{17}$ to $1\times10^{19}/cm^3$, although it is preferably undoped ($<1\times10^{17}/cm^3$) in terms of maintenance of excellent crystallinity. The type of the n-type impurity is not particularly limited. Examples thereof include Si, Ge, and Sn, and preferably Si and Ge.

The temperature for growing the under layer is preferably 800° C. to 1200° C., and it is more preferably adjusted within a range of 1000° C. to 1200° C. If grown within such a temperature range, the under layer can be readily obtained with excellent crystallinity. Moreover, the inner pressure of the MOCVD growth furnace is preferably adjusted to 15 to 40 kPa.

The n-contact layer is preferably composed of an $Al_xGa_{1-x}N$ layer ($0 \leq x \leq 1$, preferably $0 \leq x \leq 0.5$, and more preferably $0 \leq x \leq 0.1$), similar to the under layer. Moreover, the n-contact layer is preferably doped with an n-type impurity, and contains the n-type impurity at a concentration of $1\times10^{17}$ to $1\times10^{19}/cm^3$, and preferably $1\times10^{18}$ to $1\times10^{19}/cm^3$, in terms of maintenance of excellent ohmic contact with the negative electrode, prevention of cracking, and maintenance of excellent crystallinity. The type of the n-type impurity is not particularly limited. Examples thereof include Si, Ge, and Sn, and preferably Si and Ge. The growth temperature is similar to the case of the under layer.

The nitride-based compound semiconductor constituting the n-contact layer preferably has the same composition as that of the under layer. The total film thickness of these layers is preferably set within a range of 1 to 20 μm, preferably 2 to 15 μm, and more preferably 3 to 12 μm. If the total film thickness of the n-contact layer and the under layer is within such a range, the crystallinity of the semiconductor can be kept excellent.

The n-clad layer is preferably provided between the n-contact layer and the light-emitting layer 13. By providing the n-clad layer, a non flat portion occurring in the outer most surface of the n-contact layer can be filled. The n-clad layer can be formed of AlGaN, GaN, GaInN, or the like. Moreover, the n-clad layer may also take a superlattice structure having a heterojunction, or multiple laminations of these structures. In the case of GaInN, it is needless to say that the band gap is desirably greater than that of the GaInN of the light-emitting layer.

The thickness of the n-clad layer is not particularly limited, although it is preferably within a range of 0.005 to 0.5 μm, and more preferably 0.005 to 0.1 μm.

Moreover, the concentration of the n-type dopant in the n-clad layer is preferably within a range of $1\times10^{17}$ to $1\times10^{20}/cm^3$, and more preferably $1\times10^{18}$ to $1\times10^{19}/cm^3$. The dopant concentration is preferably within this range in terms of maintenance of excellent crystallinity and reduction of the operating voltage for the light-emitting device.

For the light-emitting layer 13 laminated on the n-type semiconductor layer 12, there is normally employed a light-emitting layer composed of a nitride-based compound semiconductor, and preferably a nitride-based compound semiconductor made of $Ga_{1-s}In_sN$ ($0<s<0.4$).

The thickness of the light-emitting layer 13 is not particularly limited, although it is preferably a film thickness to a degree capable of providing a quantum effect, namely a critical film thickness. For example, the thickness is within a range of 1 to 10 nm, and more preferably 2 to 6 nm. The film thickness is preferably within the above range in terms of light emission output.

Moreover, the light-emitting layer may take not only a single quantum well (SQW) structure as mentioned above, but also a multiple quantum well (MQW) structure comprising the above $Ga_{1-s}In_sN$ as a well layer, and an $Al_cGa_{1-c}N$ ($0 \leq c<0.3$ and b>c) barrier layer having a greater band gap energy than that of the well layer. Moreover, the well layer and the barrier layer may be doped with an impurity.

The temperature for growing the $Al_cGa_{1-c}N$ barrier layer is preferably 700° C. or more. It is more preferable to grow the barrier layer at 800° C. to 1100° C. since excellent crystallinity can be achieved. Moreover, the GaInN well layer is grown at 600° C. to 900° C., and preferably 700° C. to 900° C. That is, the growth temperature is preferably varied between layers so as to achieve excellent crystallinity of the MQW.

The p-type semiconductor layer 14 is normally composed of a p-clad layer and a p-contact layer. However, the p-contact layer may also function as the p-clad layer.

The p-clad layer is not particularly limited as long as the composition allows a greater band gap energy than that of the light-emitting layer and carrier confinement in the light-emitting layer 13 can be achieved, although $Al_dGa_{1-d}N$ ($0 \leq d \leq 0.4$, and preferably $0.1 \leq d \leq 0.3$) is preferred. The p-clad layer is preferably composed of such AlGaN in terms of carrier confinement in the light-emitting layer 13.

The thickness of the p-clad layer is not particularly limited, although it is preferably 1 to 400 nm and more preferably 5 to 100 nm.

The concentration of the p-type dopant in the p-clad layer is preferably $1\times10^{18}$ to $1\times10^{21}/cm^3$, and more preferably $1\times10^{19}$ to $1\times10^{20}/cm^3$. When the p-type dopant concentration is within the above range, excellent p-type crystals can be obtained without impairing the crystallinity.

The p-contact layer is a nitride-based compound semiconductor layer comprising at least $Al_eGa_{1-e}N$ ($0 \leq e<0.5$, preferably $0 \leq e \leq 0.2$, and more preferably $0 \leq e \leq 0.1$). The Al composition is preferably within the above range in terms of maintenance of excellent crystallinity and excellent ohmic contact with the p-ohmic electrode.

The p-type dopant is preferably contained at a concentration of $1\times10^{18}$ to $1\times10^{21}/cm^3$, and more preferably $5\times10^{19}$ to $5\times10^{20}/cm^3$, in terms of maintenance of excellent ohmic contact, prevention of cracking, and maintenance of excellent crystallinity.

The type of the p-type impurity is not particularly limited, although a preferred example is Mg.

The thickness of the p-contact layer is not particularly limited, although it is preferably 0.01 to 0.5 μm and more preferably 0.05 to 0.2 μm. The film thickness is preferably within this range in terms of light emission output.

A GaN-based semiconductor is generally used for the light-emitting device, although it is also possible to use a semiconductor light-emitting device made of ZnO, $Ga_2O_3$, or the like rather than such a GaN-based semiconductor.

(Titanium Oxide-Based Conductive Film Layer)

Figure 2:
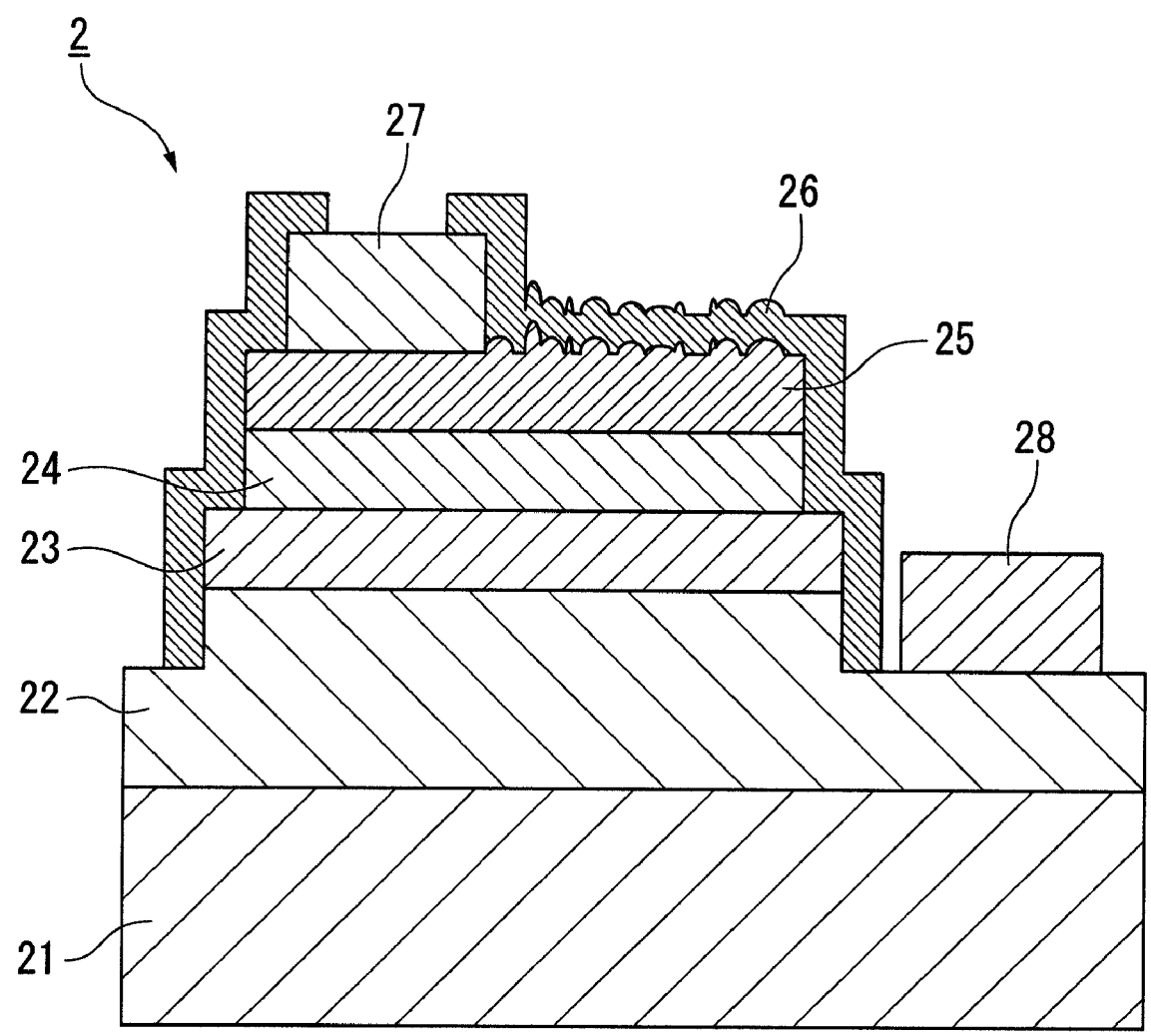
FIG. 2 is a schematic diagram illustrating another example of a light-emitting device of the present invention, showing a cross-sectional structure.

The titanium oxide-based conductive film layer of the present invention is formed directly above the p-type semiconductor layer 14 as shown in the examples of FIG. 1 and FIG. 2 (refer to reference symbols 15 and 25), or above the p-type semiconductor layer 14 via a metal layer or the like.

Moreover, the titanium oxide-based conductive film layer of the present invention has a random concavo-convex surface formed on at least a part of the surface thereof as shown in the example of FIG. 1 (refer to reference symbol 15).

When a metal layer is provided between the titanium oxide-based conductive film layer 15 and the p-type semiconductor layer 14, the drive voltage (Vf) of the light-emitting device can be reduced, although the transmittance decreases and the output is reduced. Accordingly, it is appropriately judged whether or not the metal layer should be provided between the titanium oxide-based conductive film layer 15 and the p-type semiconductor layer 14, while taking a balance between the drive voltage (Vf) and the output according to the intended use of the light-emitting device, or the like. The metal layer used herein is preferably made of Ni, Ni oxide, Pt, Pd, Ru, Rh, Re, Os, or the like.

For the titanium oxide-based conductive film layer, an oxide comprising Ti and at least one element selected from the group consisting of Ta, Nb, V, Mo, W, and Sb may be used.

In this case, for the composition of the titanium oxide-based conductive film layer, $Ti_{1-x}A_xO_2$ (A=Ta, Nb, V, Mo, W, or Sb) is preferably used. Moreover, in this composition, X is preferably within a range of 1 to 20 at %. If X is less than 1 at %, the effect of addition is small and excellent conductivity can not be achieved. Moreover, if X exceeds 20 at %, the transmittance at the wavelength of 300 to 550 nm decreases and hence the output of the light-emitting device is reduced.

More preferably, X is within a range of 2 to 10 at %.

If $Ti_{1-x}A_xO_2$ is used for the titanium oxide-based conductive film layer, the conductivity is also changed by the oxygen composition. An oxygen deficient state is preferable since the conductivity is improved. The oxygen deficient state can be made by employing various methods such as: a method in which the oxygen amount is adjusted by reactive vapor deposition or reactive sputtering with oxygen using a metal; a method in which a metal oxide tablet or target in an oxygen deficient state is used; and a method in which annealing is carried out in a reducing atmosphere of $N_2$ or $H_2$ or the like after the formation of the titanium oxide-based conductive film layer.

For the formation of the titanium oxide-based conductive film layer, any method such as a vapor deposition method, a sputtering method, a PLD method, and a CVD method may be employed.

When the vapor deposition method is employed, the film can be formed using a tablet of $Ti_{1-x}A_xO_2$ (A=Ta, Nb, V, Mo, W, or Sb) by any method such as resistance heating and EB heating.

Moreover, it is also possible to form the film from respective single metal oxides in separate vapor-deposition sources. Use of this method gives an advantage of facilitating composition control. For example, an arbitrary $Ti_{1-x}Ta_xO_2$ composition can be made by forming the film respectively from $TiO_2$ and $Ta_2O_5$ in separate vapor-deposition sources.

Furthermore, reactive film formation is also possible by using single or alloy metals under introduction of an oxygen gas with plasma, or the like. For example, a $Ti_{1-x}Ta_xO_2$ composition can be made by evaporating Ti and Ta in separate vapor-deposition sources, followed by a reaction of Ti and Ta with an oxygen gas in plasma. Moreover, in order to improve the adhesiveness and the denseness, the substrate may be heated, or ion assist may be also applied.

When the sputtering method is employed, the film can be formed using a tablet of $Ti_{1-x}A_xO_2$ (A=Ta, Nb, V, Mo, W, or Sb) by any method such as RF and DC.

Moreover, it is also possible to form the film from respective single metal oxides in separate targets. Use of this method gives an advantage of facilitating composition control. For example, an arbitrary $Ti_{1-x}Ta_xO_2$ composition can be made by forming $TiO_2$ and $Ta_2O_5$ respectively in separate targets.

Furthermore, reactive sputtering film formation is also possible by using single or alloy metals under introduction of an oxygen gas. For example, a $Ti_{1-x}Ta_xO_2$ composition can be made by electrically discharging Ti and Ta in separate targets, followed by a reaction of Ti and Ta with an oxygen gas in plasma. Moreover, in order to improve the adhesiveness and the denseness, the substrate may be heated, or biasing may also be applied.

The crystal structure of the titanium oxide-based conductive film layer is not particularly limited, although an anatase type is preferred since the conductivity is excellent. However, an anatase type is the crystal structure having the highest photocatalytic reactivity, and therefore, the photocatalytic reaction-prevention layer needs to be a denser film.

The thickness of the titanium oxide-based conductive film layer is not particularly limited, although it is preferably within a range of 10 nm to 10 μm (10000 nm). If the thickness of the titanium oxide-based conductive film layer is less than 10 μm, the layer is too thin to provide sufficient conductivity. Moreover, the upper limit of the thickness of the titanium oxide-based conductive film layer is not particularly limited, although 10 μm is considered to be the upper limit in terms of productivity.

(Photocatalytic Reaction-Prevention Layer)

The photocatalytic reaction-prevention layer of the present invention is formed directly above the titanium oxide-based conductive film 15 or above the titanium oxide-based conductive film 15 through another transparent layer, as shown in the example of FIG. 1 (refer to reference symbol 16).

Moreover, the photocatalytic reaction-prevention layer 16 shown in FIG. 1 has a concavo-convex surface on at least a part of the surface thereof as the underlying titanium oxide-based conductive film 15 is formed with the random concavo-convex surface on at least a part of the surface thereof.

As generally well-known, titanium oxide has a photocatalytic action and has a property to decompose water and organic matters. The photocatalytic action is widely used in industry as one which exerts useful effects such as air purification, water purification, antifouling, and antibacterial. However, in a light-emitting device sealed in an organic substance such as a resin to constitute a lamp, there is a problem in that the sealing resin is decomposed and causes negative effects on the light-emitting device.

In a photocatalyst it is known that the photocatalytic action works with a wavelength of 380 nm or less in undoped titanium oxide, and with a wavelength of up to 500 nm in titanium oxide doped with nitrogen or tungsten.

Moreover, it is known that the quantity of light has to be several tens of $\mu W/cm^2$ or more for exerting the photocatalytic action. Accordingly, when titanium oxide is used in a light-emitting device having an emission wavelength of 300 to 550 nm, the situation becomes extremely easy for the titanium oxide to exert the photocatalytic action. Furthermore, when titanium oxide is used in a GaN-based light-emitting device, the device has to be used under an extremely large quantity of light of 1 $W/cm^2$, as is apparent from the fact that an emission intensity of about 10 mW can be obtained from a device of 300 μm-square.

In the case of a light-emitting device having an emission wavelength of 550 nm, the peak wavelength becomes 550 nm. However, many light-emitting devices have a wavelength distribution of constant width, even a light-emitting device having a peak wavelength of 550 nm often has a wavelength of 500 nm. Moreover, in the case of a light-emitting device having several peak wavelengths, if any of these peak wavelengths is present within a range of 300 to 550 nm, the situation becomes easy for titanium oxide to exert the photocatalytic action, which may cause concern of decomposition of the sealing resin as mentioned above.

In the present invention, in order to prevent the aforementioned photocatalytic action, the photocatalytic reaction-prevention layer 16 is provided.

The photocatalytic reaction-prevention layer 16 is preferably formed so as to cover the lateral faces of the titanium oxide-based conductive film 15 in order to prevent the photocatalytic action through the lateral faces.

Furthermore, as the semiconductor light-emitting device 2 shown in FIG. 2, it is further preferable that the photocatalytic reaction-prevention layer 26 is arranged so as to cover the lateral faces of the n-type semiconductor layer 22, the light-emitting layer 23, and the p-type semiconductor layer 24, and the peripheral area of the top surface of the p-type semiconductor layer 24, since this can prevent the photocatalytic action due to intrusion of moisture or the like from the interface between the photocatalytic reaction-prevention layer 26 and the p-type semiconductor layer 24. Moreover, in order to prevent the photocatalytic action from the joining area between the positive electrode 27 and the titanium oxide-based conductive film 25 into the lateral faces of the positive electrode 27, then as shown in the illustrated example, it is preferable that the photocatalytic reaction-prevention layer 26 be formed so as to cover the peripheral area of the top surface of the positive electrode 27.

As mentioned above, another transparent film or the like may be provided between the titanium oxide-based conductive film and the photocatalytic reaction-prevention layer. From the viewpoint of improving the light extraction efficiency, it is particularly preferable to provide a transparent film having a refractive index that is between the refractive indexes of the titanium oxide-based conductive film (refractive index of 2.6) and the photocatalytic reaction-prevention layer.

For example, when $SiO_2$ (refractive index of 1.5) or $Al_2O_3$ (refractive index of 1.6) is used for the photocatalytic reaction-prevention layer, $CeO_2$ (refractive index of 2.2), $HfO_2$ (refractive index of 1.9), MgO (refractive index of 1.7), ITO (refractive index of 1.9), $Nb_2O_5$ (refractive index of 2.3), $Ta_2O_5$ (refractive index of 2.2), $Y_2O_3$ (refractive index of 1.9), ZnO (refractive index of 2.1), $ZrO_2$ (refractive index of 2.1) or the like may be used as the transparent film.

The photocatalytic reaction-prevention layer of the present invention has a light transmission property, in addition to the role of preventing the photocatalytic action.

The photocatalytic reaction-prevention layer of the present invention is preferably made of a translucent substance having a transmittance of 80% or more with a wavelength between 300 to 550 nm.

Moreover, any of an insulating transparent film and a conductive transparent film can be used for the photocatalytic reaction-prevention layer.

For the insulating transparent film used as the photocatalytic reaction-prevention layer, any substance may be employed as long as it has an insulation property and a transmittance of 80% or more with a wavelength between 300 to 550 nm. Preferable examples thereof include silicon oxide (such as $SiO_2$), aluminum oxide (such as $Al_2O_3$), hafnium oxide (such as $HfO_2$), niobium oxide (such as $Nb_2O_5$), tantalum oxide (such as $Ta_2O_5$), silicon nitride (such as $Si_3N_4$), and aluminum nitride (such as AlN). It is more preferable to employ $SiO_2$ or $Al_2O_3$, since a dense film can be readily produced through CVD film formation. It is even more preferable to form a film of $Al_2O_3$ through the CVD method since the reliability under high temperature and high humidity is further improved.

When a film of $SiO_2$ is formed through CVD, there may be employed TEOS (tetraethoxysilane), TMS (trimethoxysilane), $SiH_4$, or the like as a raw material.

Moreover, when a film of $Al_2O_3$ is formed through CVD, there may be employed TMA (trimethylaluminum), DMA (dimethylaluminum), alkoxy compounds (isopropoxydimethylaluminum, sec-butoxydimethylaluminum, isopropoxydiethylaluminum, and tert-butoxydimethylaluminum), or the like as a raw material.

For the conductive transparent film used as the photocatalytic reaction-prevention layer, any substance may be employed as long as it has conductivity and a transmittance of 80% or more at a wavelength within a range of 300 to 550 nm. Preferable examples thereof include ITO ($In_2O_3$—$SnO_2$), AZO (ZnO—$Al_2O_3$), IZO ($In_2O_3$—ZnO), and GZO (ZnO—$Ga_2O_3$).

Figure 3:
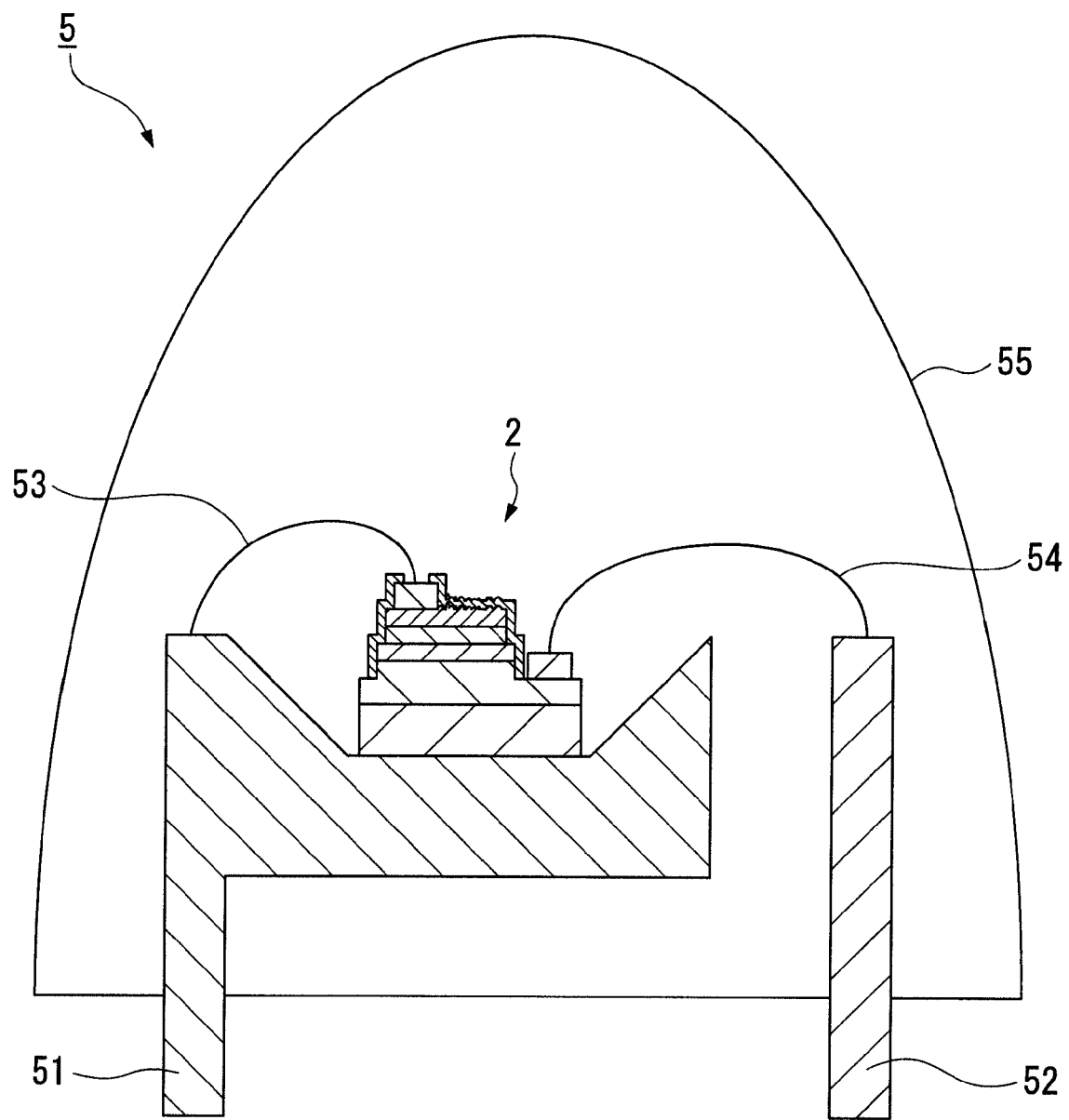
FIG. 3 is a schematic diagram illustrating an example of a lamp of the present invention, showing a cross-sectional structure.

When the conductive transparent film is used, as the semiconductor light-emitting device 3 shown in FIG. 3, the conduction area between the photocatalytic reaction-prevention layer and the p-type semiconductor is increased by the contact area of the conductive transparent film constituting the photocatalytic reaction-prevention layer, which is advantageous for reducing the drive voltage (Vf).

The refractive indexes of ITO and IZO are 1.9, and the refractive indexes of AZO and GZO are 2.1, which is advantageous for improving the light extraction efficiency as described above. In addition, when the concavo-convex is formed on the surface of the titanium oxide-based conductive film, the total refraction of the interface between the titanium oxide-based conductive film and the conductive transparent film is reduced to thereby further improve the light extraction efficiency.

In addition, when the conductive transparent film is used for the photocatalytic reaction-prevention layer, the light-emitting layer and the n-type semiconductor layer cannot be covered. Thus, the insulating transparent film may be formed on the conductive transparent film so as to cover the light-emitting layer and the n-type semiconductor layer.

Furthermore, the photocatalytic reaction-prevention layer needs to be a dense film. In order to produce the abovementioned silicon oxide film, there is employed a method using a liquid coating material such as SOG (spin-on glass). However, this method is not suitable for the photocatalytic reaction-prevention layer of the present invention, since a dense film is hardly formed and moisture remains in the film even if annealed.

For the formation of the photocatalytic reaction-prevention layer, a film formation method capable of producing dense films, such as sputtering and CVD, may be employed. In particular, CVD is preferably employed since denser films can be produced.

The thickness of the photocatalytic reaction-prevention layer is not particularly limited, although it is preferably within a range of 10 nm to 10 μm (10000 nm). If the thickness of the photocatalytic reaction-prevention layer is less than 10 nm, the layer is too thin to prevent moisture intrusion. Moreover, the upper limit of the thickness of the photocatalytic reaction-prevention layer is not particularly limited, although 10 μm is considered to be the upper limit in terms of productivity.

Furthermore, the photocatalytic action of the titanium oxide-based conductive film can be weakened by doping the titanium oxide-based conductive film with iron, aluminum, magnesium, zirconium, or the like. Therefore, the structure may be such that the abovementioned photocatalytic reaction-prevention layer is provided after doping with such an element.

However, the dose of such an element which weakens the photocatalytic action as mentioned above needs to be within a range that would not remarkably spoil the conductivity and transmittance of the titanium oxide-based conductive film.
(Positive Electrode and Negative Electrode)

The positive electrode 17 is a bonding pad provided on the titanium oxide-based conductive film 15. In the example shown in FIG. 1, the lateral faces and peripheral area of the top surface are covered by the photocatalytic reaction-prevention layer 16.

For the material of the positive electrode 17, various structures using Au, Al, Ni, Cu, and the like are well known. These well known materials and structures may be employed without any limitation.

The thickness of the positive electrode 17 is preferably within a range of 100 nm to 10 μm. Moreover, in terms of the property of the bonding pad, the thickness is preferably larger since the bondability becomes higher. Therefore, the thickness of the positive electrode 17 is more preferably 300 nm or more. Furthermore, the thickness is preferably 3 μm or less in terms of the production cost.

As shown in the illustrated example of FIG. 1, the negative electrode 18 is a bonding pad formed to be in contact with the abovementioned n-type semiconductor layer 12 of the gallium nitride-based compound semiconductor in which the n-type semiconductor layer 12, the light-emitting layer 13, and the p-type semiconductor layer 14 are sequentially laminated on the substrate 11.

Therefore, for forming the negative electrode 18, a part of the light-emitting layer 13 and the p-type semiconductor layer 14 is removed to expose the n-contact layer of the n-type semiconductor layer 12, and the negative electrode 18 is formed thereon.

For the material of the negative electrode 18, negative electrodes of various compositions and structures are well known. These well known negative electrodes may be employed without any limitation, and can be provided through a commonly used means which is well known in this technical field.

[Method of Forming Random Concavo-Convex on Surface of Titanium Oxide-Based Conductive Film Layer]

As the method of forming a random concavo-convex shape (refer to the convex parts 25a in FIG. 2) on the surface of the titanium oxide-based conductive film layer, photolithography and nanoimprint lithography can be employed, although for example, a method including the following steps of (1) to (3) can be enumerated as a method capable of forming concavo-convex at low cost:

a step (1) of laminating, on a substrate, an n-type semiconductor layer, a light-emitting layer, a p-type semiconductor layer, and a titanium oxide-based conductive film layer in this order;

a step (2) of forming a mask made of fine metal particles on the titanium oxide-based conductive film layer; and a step (3) of etching the titanium oxide-based conductive film layer from above the mask.

In the above method, a concavo-convex surface on the titanium oxide-based conductive film layer is formed by forming a mask made of fine metal particles (i.e. metal microparticles) on a concavo-convex surface treatment area in the surface of the titanium oxide-based conductive film layer, and by etching the titanium oxide-based conductive film layer from thereabove. By so doing, random concavo-convex can be formed.

First is a description of the shape of the mask of fine metal particles.

In the present example, since the shape of the concavo-convex on the titanium oxide-based conductive film layer is defined by the shape of the mask of fine metal particles, then the shape of the concavo-convex on the titanium oxide-based conductive film layer can be controlled by controlling the shape of the mask of fine metal particles. In particular, the thickness of the mask of fine metal particles greatly affects the shape of the concavo-convex on the titanium oxide-based conductive film layer.

In the present embodiment, the aforementioned step (2) can be composed of a step of forming a metal thin film on the surface of the titanium oxide-based conductive film layer and a heat treatment step following the formation of the metal thin film.

For the formation of the mask of fine metal particles, the thickness of the metal thin film to be formed on the surface of the titanium oxide-based conductive film layer prior to the heat treatment step is preferably within a range of 0.005 μm to 1 μm.

Although the optimum value of the film thickness varies depending on the mask material and the sealing resin material for making a lamp, if it is less than 0.005 μm, the film does not function as a mask, and effective concavo-convex for light extraction can not be formed on the titanium oxide-based conductive film layer. Moreover, if the film thickness exceeds 1 μm, the aggregating effect is decreased, and effective concavo-convex for light extraction can not be formed on the titanium oxide-based conductive film layer, similarly to the above.

The density of the fine metal particles in the mask is preferably within a range of $1\times10^5/mm^2$ to $1\times10^8/mm^2$. If it is within this range, concavo-convex for effectively improving the light extraction can be formed on the titanium oxide-based conductive film layer. More preferably, the density is within a range of $1\times10^6/mm^2$ to $1\times10^7/mm^2$.

Next is a description of the shape of the concavo-convex to be formed on the titanium oxide-based conductive film layer by etching.

The mean value of the center-to-center distance between convex parts defined by the peak-to-peak distance between convex parts on the titanium oxide-based conductive film layer is preferably within a range of 0.01 μm to 3 μm.

If the mean value of the center-to-center distance between convex parts is less than 0.01 μm, the convex parts are so dense that the light extraction efficiency is lowered. Moreover, if the mean value of the center-to-center distance between convex parts exceeds 3 μm, the distance becomes too large to provide a sufficient light extraction efficiency. A more preferable range of the mean value of the center-to-center distance between convex parts is 0.05 μm to 1.5 μm. Within this range, the light extraction efficiency is effectively improved.

The standard deviation of the center-to-center distance between the convex parts from the mean value of the center-to-center distance between the convex parts is preferably within a range of 10% to 80%, and more preferably a range of 20% to 60%.

When the standard deviation is less than 10%, the interference effect increases, and the wavelength unevenness is more likely to occur. When the standard deviation exceeds 80%, the density of the concavo-convex pattern decreases, and the effect of improving the light extraction efficiency is reduced.

The mean value of the diameter of the bottom face of the convex part on the titanium oxide-based conductive film layer is preferably within a range of 0.01 to 3 μm. With this range, the light extraction efficiency is effectively improved.

Moreover, if the mean value of the diameter of the bottom face of the convex part is less than 0.01 µm, the diameter becomes too small to contribute to the improvement of the light extraction efficiency. Moreover, if the mean value of the diameter of the bottom face of the convex part exceeds 3 µm, the diameter becomes too large to provide a sufficient light extraction efficiency. A more preferable range of the mean value of the diameter of the bottom face of the convex part is 0.1 µm to 2 µm.

The mean value of the height of the convex parts on the titanium oxide-based conductive film layer is preferably within a range of 0.1 µm to 2.0 µm.

If the mean value of the height of the convex parts is less than 0.1 µm, the height is insufficient to contribute to an improvement of the light extraction efficiency. Moreover, if the mean value of the height of the convex parts exceeds 2.0 µm, the height is able to contribute to an improvement of the light extraction efficiency, but is not suitable since the productivity is greatly lowered.

More preferably, the size of the convex parts satisfies the relation of (diameter of bottom face of convex part)<(height of convex part). This relation is able to more effectively improve the light extraction efficiency.

Next is a description of the method of forming a concavo-convex surface treatment area in the abovementioned specific shape on the titanium oxide-based conductive film layer.

In the present invention, the concavo-convex surface treatment area on the titanium oxide-based conductive film layer can be formed by forming a mask made of fine metal particles on the surface of the titanium oxide-based conductive film layer of the concerned area, and dry etching the titanium oxide-based conductive film layer from thereabove.

For the material of fine metal particles to be used for the mask, spherically-shaped fine particles with excellent aggregating property are preferred. Examples of such a metal include Ni and Ni alloy. Moreover, for the material of fine metal particles suitable for improving the efficiency of the process as well as having the aggregating property, low melting point metals or low melting point alloys containing at least one type of metal selected from Ni, Au, Sn, Ge, Pb, Sb, Bi, Cd, and In, and having a melting point between 100° C. to 450° C. can be enumerated. Among these metal materials, an AuSn alloy, an AuGe alloy, an AuSnNi alloy, and an AuGeNi alloy are preferably used, and most preferable is the AuSn alloy.

The AuSn alloy is known to become eutectic at a temperature of about 190° C. to 420° C., if the Sn composition ratio is within a range of about 10 mass % to 35 mass %. It is also known that, if the temperature goes above this range, the alloy layer generally takes an aggregated form.

For the formation of the mask of fine metal particles, first, a metal thin film is formed using a generally known vacuum vapor deposition apparatus.

The thickness of the metal thin film is preferably 50 Å or more but 1000 Å or less.

Moreover, use of a sputtering instrument or the like is not a problem as long as the thickness of the metal thin film can be evenly controlled within the above range.

In order to obtain a mask made of fine metal particles, generally a heat treatment within a temperature range of 100° C. to 600° C. for 1 minute or more is applied on the formed metal thin film, although the condition depends on the metal to be used.

The shape of the mask of fine metal particles after the heat treatment varies depending on the oxygen concentration in the heat treatment atmosphere. By controlling the oxygen concentration according to the material to be used, a mask of fine metal particles capable of forming a concavo-convex pattern of a shape suitable for improving the light extraction efficiency on the titanium oxide-based conductive film can be obtained. Moreover, the heat treatment may also be preferably performed under an atmosphere without any oxygen at all, in some cases depending on the material of the fine metal particles to be used.

After the formation of the mask of fine metal particles, a concavo-convex surface in the abovementioned specific shape can be formed by dry etching the titanium oxide-based conductive film layer from above the mask. For the dry etching, a typical dry etching of a reactive ion etching (RIE) type can be employed. For the gas species, any gas may be used without limitation, although etching with use of a chlorine-containing gas is preferred. In order to avoid the change in the shape of metallic aggregate (shape of fine metal particles) due to heat, the substrate temperature is desirably kept at 100° C. or less.

Alternatively, wet etching can be employed as the method of forming the concavo-convex shape on the titanium oxide-based conductive film layer. In this case, the aforementioned metal thin film may be formed, or not.

When wet etching is performed, hydrofluoric acid, phosphoric acid, sulfuric acid, hydrochloric acid, hydrofluoric acid/nitric acid mixture, hydrofluoric acid/hydrogen peroxide mixture, hydrofluoric acid/ammonium fluoride mixture, hydrofluosilicic acid, or the like may be employed as an etching liquid, although hydrofluoric acid, hydrofluoric acid/nitric acid mixture, hydrofluoric acid/hydrogen peroxide mixture, hydrofluoric acid/ammonium fluoride mixture, and hydrofluosilicic acid ($H_2SiF_6$) are more preferably employed.

[Step Coverage]

When a concavo-convex shape is formed on the titanium oxide-based conductive film, the step coverage of a film formed thereon becomes a problem. For example, if the slope of the concavo-convex is too steep, if the aspect ratio is too large, or if the size of the concavo-convex is too small, then the film to be formed on the titanium oxide-based conductive film is not formed along the profile of the concavo-convex and generates a gap. If a gap is generated, the refractive index in that area becomes 1, which causes a lowering of the light extraction efficiency.

As the film formation method for improving the step coverage, a CVD method and a sputtering method are suitable. When a film is formed by the sputtering method, it is more preferable to employ a method in which a high frequency power source (13 MHz or more, and more preferably 60 MHz±10 MHz) is used for the sputter source which biases the surface of the formed film.

With respect to the shape of the concavo-convex, rectangular convex parts as shown in FIG. 4A are not capable of providing excellent step coverage. In order to obtain excellent step coverage, the bottom end dimension of the convex part is preferably greater than the top end dimension thereof. A shape in which the dimension is gradually tapered from the bottom end to the top end is more preferred.

Specifically preferred examples thereof include slope-shaped convex parts as shown in FIG. 4B and curved-shaped convex parts as shown in FIG. 4C. In the case of the slope-shaped convex parts, the inclination with respect to the normal line of the substrate is preferably 5 degrees or more, since the step coverage is improved. However, if the inclination with respect to the normal line of the substrate is too large, it is difficult to obtain the aspect ratio. Therefore, the angle is preferably set to 60 degrees or less.

[Structure of Lamp]

The light-emitting device of the present invention may be constituted as an LED lamp using a method known to those skilled in the art, without any limitation.

FIG. 3 is a cross-sectional view which schematically illustrates an example of a lamp of the present invention. This lamp 5 comprises the semiconductor light-emitting device 2 composed of the face-up type nitride-based semiconductor of the present invention shown in FIG. 2, mounted in a projectile shape. In FIG. 3, reference symbols 51 and 52 denote frames, reference symbols 53 and 54 denote wires, and reference symbol 55 denotes a mold.

The lamp 5 can be produced using the semiconductor light-emitting device 2 of the present invention shown in FIG. 2, by an already known method. Specifically, for example, the projectile-shaped lamp shown in FIG. 3 can be produced by the following manner. The semiconductor light-emitting device 2 is adhered onto either one of the two frames 51 and 52 (frame 51 in FIG. 3) with a resin or the like. The positive electrode and the negative electrode of the semiconductor light-emitting device 2 (refer to reference symbols 27 and 28 shown in FIG. 2) are respectively joined to the frames 51 and 52 with the wires 53 and 54 made of a material such as gold. Then, the surroundings of the semiconductor light-emitting device 2 are molded with a mold 55 made of a transparent resin.

The lamp of the present invention is not limited to the above structure, and for example a white lamp may also be constituted by a combination of the semiconductor light-emitting device of the present invention and a cover having a fluorescent substance.

Moreover, the lamp of the present invention may be used for any application, such as a projectile type for general use, a side view type for use in a portable back light, and a top view type for use in an indicator.

Since the light-emitting device of the present invention is highly reliable with excellent light extraction efficiency, a lamp with excellent light emission properties can be realized.

EXAMPLES

Next is a more detailed description of the light-emitting device of the present invention and a lamp using the same, with reference to Examples. It should be noted that the present invention is not to be limited to these Examples.

Experimental Example 1

Figure 5:
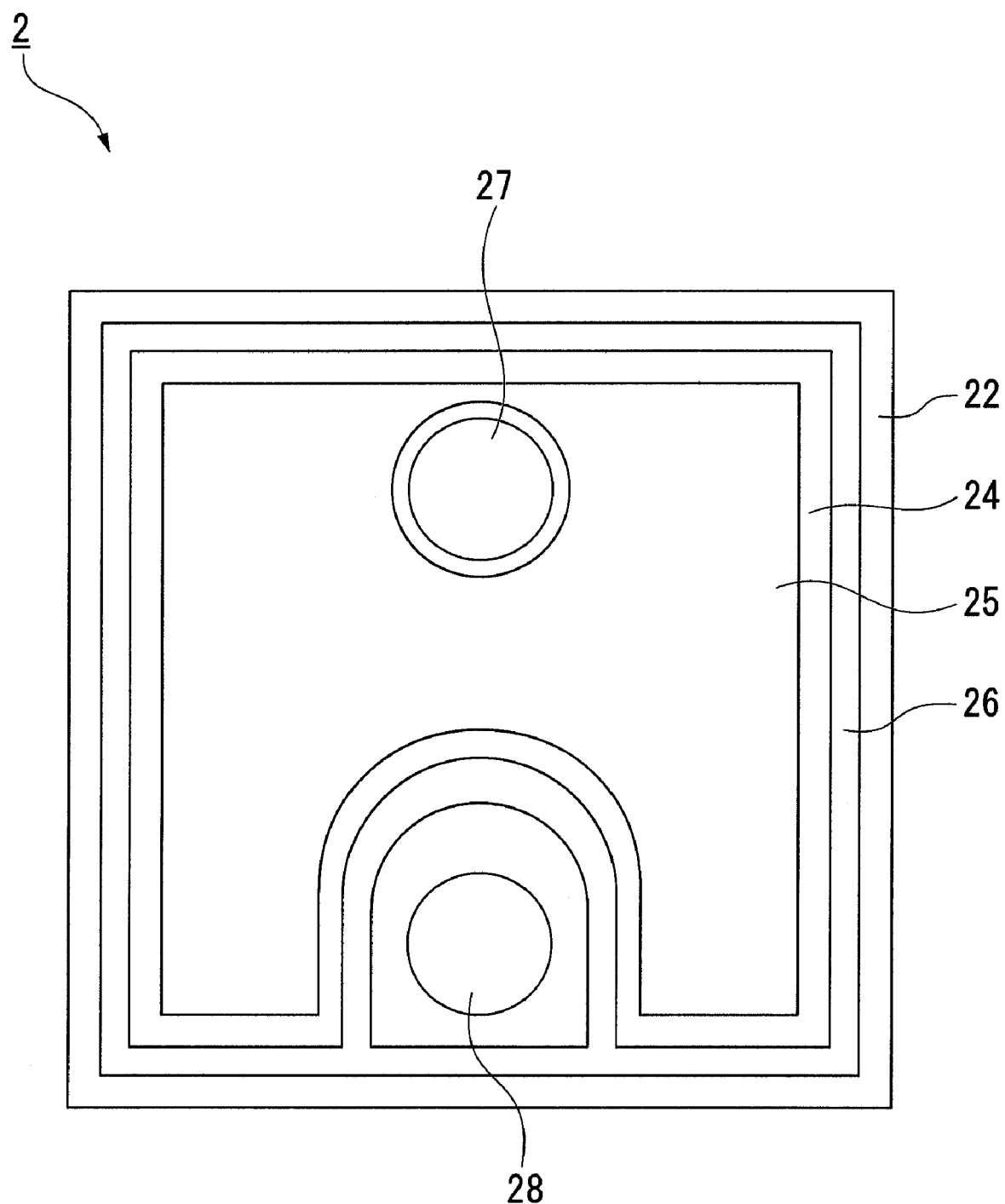
FIG. 5 is a schematic diagram illustrating the light-emitting device of the present invention, showing a planar structure of the light-emitting device shown in FIG. 2.

FIG. 2 shows a cross-sectional schematic diagram of a gallium nitride-based compound semiconductor light-emitting device produced in the present Experimental Example. FIG. 5 shows a planar schematic diagram thereof.
(Production of Gallium Nitride-Based Compound Semiconductor Light-Emitting Device)

On a substrate 21 made of sapphire was laminated a gallium nitride-based compound semiconductor layer via a buffer layer made of AlN. This gallium nitride-based compound semiconductor layer comprised:

an n-type semiconductor layer 22 in which an under layer of undoped GaN in a thickness of 8 μm, a Ge-doped n-type GaN-contact layer in a thickness of 2 μm, and an n-type $In_{0.1}Ga_{0.9}N$-clad layer in a thickness of 0.02 μm were laminated in this order;

a light-emitting layer 23 of a multiple quantum well structure obtained by five laminations of a Si-doped GaN barrier layer in a thickness of 16 nm and an $In_{0.06}Ga_{0.94}N$ well layer in a thickness of 2.5 nm with a barrier layer on the top; and a p-type semiconductor layer 24 in which a Mg-doped p-type $Al_{0.07}Ga_{0.93}N$-clad layer in a thickness of 0.01 μm and a Mg-doped p-type $Al_{0.02}Ga_{0.98}N$-contact layer in a thickness of 0.18 μm were laminated in this order.

These respective layers were laminated in this order to form the gallium nitride-based compound semiconductor layer. The light extraction surface was set on the semiconductor side.

In this structure, the carrier density of the n-type GaN-contact layer was $1\times10^{19}$ cm$^{-3}$, the Si dope amount of the GaN barrier layer was $1\times10^{17}$ cm$^{-3}$, the carrier density of the p-type AlGaN-contact layer was $5\times10^{18}$ cm$^{-3}$, and the Mg dope amount of the p-type AlGaN-clad layer was $5\times10^{19}$ cm$^{-3}$.

Moreover, layers of the gallium nitride-based compound semiconductor layer (reference symbols 22, 23, 24, and 25 in FIG. 2) were laminated by the MOCVD method, under usual conditions well known to those skilled in the art.

Then, this gallium nitride-based compound semiconductor layer was subjected to a reactive ion etching method to expose the n-type GaN-contact layer of an area for forming the negative electrode. In this case, first, a resist was evenly applied onto the whole surface of the p-type semiconductor layer, and then the resist was removed from the area for forming the negative electrode using a known lithography technique. Then, the resultant product was set in a vacuum vapor deposition apparatus to laminate Ni in a thickness of about 50 nm and Ti in a thickness of 300 nm by an electron beam method under a pressure of $4\times10^{-4}$ Pa or less. Then, the metal films together with the resist in areas other than the area for forming the negative electrode were removed by lift-off technique.

Next, the semiconductor laminate substrate was mounted on an electrode in the etching chamber of a reactive ion etching apparatus. The pressure in the etching chamber was reduced to $10^{-4}$ Pa, and then $Cl_2$ as an etching gas was supplied to etch until the n-type GaN-contact layer was exposed. After etching, the resultant product was taken out from the reactive ion etching apparatus, followed by removal of the etching mask with nitric acid and hydrofluoric acid.
(Formation of Titanium Oxide-Based Conductive Film)

Next, using a known photolithography technique and lift-off technique, a titanium oxide-based conductive film layer 25 comprising a Ni contact metal layer in a thickness of 1 nm and a layer made of $Ti_{0.95}Nb_{0.05}O_2$ in a thickness of 1 μm was formed only in an area for forming the positive electrode on the surface of the p-type AlGaN-contact layer (p-type semiconductor layer 24).

The titanium oxide-based conductive film layer was formed by first placing the substrate laminated with the gallium nitride-based compound semiconductor layer into a vacuum sputtering apparatus, and then the laminating $Ti_{0.95}Nb_{0.05}O_2$ on the p-type AlGaN-contact layer.

Then, the substrate laminated with the gallium nitride-based compound semiconductor layer was taken out from the vacuum sputtering apparatus, and was subjected to a heat treatment make it transparent.
(Formation of Concavo-Convex Pattern)

Next, using a known photolithography technique, a resist film was formed on portions other than the surface of the titanium oxide-based conductive film layer, and the substrate was then placed in a vapor deposition apparatus to laminate Au/Sn in a thickness of 15 nm.

Next, in a nitrogen atmosphere, a heat treatment was performed at a temperature of 250° C. to make granular aggregations in the Au/Sn thin film so as to form a mask made of fine metal particles. The diameter of the fine metal particles was within a range of 0.2 to 1.5 μm, and a highly dense layer (mask) of fine metal particles at $2\times10^6$ pieces/mm$^2$ was formed.

Next, patterning was performed using the resist film so as to expose the surface of the titanium oxide-based conductive film layer, followed by general dry etching.

Here, since the abovementioned mask of fine metal particles was formed on the area to be treated for the concavo-convex pattern, etching was selectively performed in a shape corresponding to the shape of the fine metal particles through dry etching, and the surface of the titanium oxide-based conductive film layer was successfully treated to have a curved concavo-convex pattern.

This convex part was in a round shape in the top view. The mean value of the bottom end dimension was about 0.7 μm (diameter), and the mean value of the height T was about 1.0 μm. The mean value of the distance between convex parts was 0.8 μm, and the standard deviation with respect to this value was 50%.

(Formation of Bonding Pad)

Next, the positive electrode (bonding pad) 27 and the negative electrode (bonding pad) 28 were formed by the following procedure.

First, normally, treatments were performed according to a known procedure called lift-off. Furthermore, a first layer comprising Au, a second layer comprising Ti, a third layer comprising Al, a fourth layer comprising Ti, and a fifth layer comprising Au were sequentially laminated on a part of the titanium oxide-based conductive film by a similar lamination method, to form a five-layered positive electrode 27. Here, the thicknesses of respective layers comprising Au/Ti/Al/Ti/Au were respectively set to 50/20/10/100/500 nm.

Next, on the n-type GaN-contact layer which had been exposed though the abovementioned reactive ion etching method, the negative electrode bonding pad was formed by the following procedure.

First, a resist was evenly applied onto the whole surface of the exposed area of the n-type GaN-contact layer, and then the resist was removed from the portion for forming the negative electrode on the exposed n-type GaN-contact layer using a known lithography technique. Then, the negative electrode 28 comprising Ti in a thickness of 100 nm and Au in a thickness of 200 nm sequentially from the semiconductor side, was formed by a normally used vacuum vapor deposition method. The resist was then removed by a known method.

(Formation of Photocatalytic Reaction-Prevention Layer)

Next, using a known photolithography technique and lift-off technique, a photocatalytic reaction-prevention layer made of $Al_2O_3$ was formed by the CVD method in a thickness of 500 nm on areas other than the central parts of the positive electrode and the negative electrode. The photocatalytic reaction-prevention layer was formed so as to cover the lateral faces of the positive electrode, the lateral faces of the negative electrode, the light-emitting layer, and the lateral faces of the n-type semiconductor.

(Division of Device)

The wafer formed up to the photocatalytic reaction-prevention layer in this manner was ground and polished on the back face of the substrate 11 to thereby thin the thickness of the substrate 11 to 80 μm. Ruled lines were drawn using a laser scriber from the semiconductor laminate side, and the layer was pressingly broken to cut it into 350 μm-square chips. These chips were used as the semiconductor light-emitting device of Experimental Example 1.

(Measurement of Drive Voltage (Vf) and Light Emission Output (Po))

An electric current was applied to each of the chips obtained as mentioned above using a probe needle. The forward voltage at the applied current of 20 mA was measured, and the drive voltage (Vf) was investigated. The results are shown in Tables 1 and 2 below.

Also, each of the obtained chips was mounted in a TO-18 can package, and the light emission output at the applied current of 20 mA was measured using a tester. The results are shown in Tables 1 and 2 below.

Further, the light emission distributions on the light emission surfaces of the obtained chips were investigated. As a result, the light emissions were confirmed on the entire surface on the positive electrode.

(Measurement of Light Distribution Property)

Each of the aforementioned chips was mounted in a TO-18 can package, and the light distribution property was measured. For the measurement of the light distribution property, LED-1100 manufactured by Opto Science, Inc. was used.

First, the detector placed above the chip was moved along the orbit that was parallel to one side of the chip and kept a fixed distance with the chip, and the light emission output was measured. Next, the detector was moved along the orbit that was parallel to the side perpendicular to the aforementioned side and kept a fixed distance with the chip, and the light emission output was measured.

There was no difference in the distribution of the light emission outputs that was measured for each of the sides as a function of the angle between the substrate surface and the line connecting the detector with the center of the chip.

The semiconductor light-emitting devices of Experimental Examples 2 to 10 and Experimental Examples 12 to 14 were produced in the same manner as that of Experimental Example 1, and were subjected to the same evaluations, except that the film formation condition of the mask of the fine metal particles was changed to the conditions shown in following Tables 1 and 2 and the concavo-convex patterns were formed so as to adjust the center-to-center distance between the convex parts formed on the surface of the titanium oxide-based conductive film layer, the lower end width, and standard deviation to the values shown in following Tables 1 and 2.

In addition, the semiconductor light-emitting device of Experimental Example 11 was produced in the same manner as that of Experimental Example 1 except that the concavo-convex pattern containing the convex parts was not formed on the surface of the titanium oxide-based conductive film.

A list of the conditions for the formation, and characteristics of the devices of the respective Experimental Examples is shown in Tables 1 and 2.

TABLE 1

| | Material of mask of fine metal particles | Melting point of mask of fine metal particles (° C.) | Heat treatment temperature (° C.) | Mean distance between convex parts (μm) | Standard deviation from mean distance between convex parts (%) | Mean lower end width of convex parts (μm) | Drive voltage (Vf) (V) | Light emission output (Po) (mW) |
|---|---|---|---|---|---|---|---|---|
| Experimental Example 1 | Au/Sn (Sn: 20 wt %) | 278 | 250 | 0.8 | 50 | 0.5 | 3.3 | 13.4 |

TABLE 1-continued

| | Material of mask of fine metal particles | Melting point of mask of fine metal particles (° C.) | Heat treatment temperature (° C.) | Mean distance between convex parts (μm) | Standard deviation from mean distance between convex parts (%) | Mean lower end width of convex parts (μm) | Drive voltage (Vf) (V) | Light emission output (Po) (mW) |
|---|---|---|---|---|---|---|---|---|
| Experimental Example 2 | Ni | 1455 | 600 | 0.4 | 55 | 0.2 | 3.3 | 12.8 |
| Experimental Example 3 | Au/Ge (Ge: 14 wt %) | 361 | 450 | 0.5 | 40 | 0.3 | 3.3 | 12.7 |
| Experimental Example 4 | Au/Pb (Pb: 84 wt %) | 213 | 220 | 0.8 | 30 | 0.5 | 3.3 | 12.6 |
| Experimental Example 5 | Au/In (In: 28 wt %) | 224 | 230 | 0.8 | 30 | 0.6 | 3.3 | 13.1 |
| Experimental Example 6 | Au/Bi (Bi: 87 wt %) | 241 | 250 | 0.8 | 20 | 0.5 | 3.3 | 13.2 |
| Experimental Example 7 | Au/Cd (Cd: 48 wt %) | 309 | 320 | 0.6 | 15 | 0.4 | 3.3 | 12.8 |
| Experimental Example 8 | Au/Sb (Sb: 25 wt %) | 380 | 400 | 0.6 | 30 | 0.4 | 3.3 | 12.6 |
| Experimental Example 9 | Pb/Bi (Bi: 55 wt %) | 126 | 150 | 1 | 35 | 0.7 | 3.3 | 12.4 |
| Experimental Example 10 | Pb/Sb (Sb: 12 wt %) | 252 | 260 | 0.8 | 45 | 0.6 | 3.3 | 12.4 |

TABLE 2

| | Material of mask of fine metal particles | Melting point of mask of fine metal particles (° C.) | Heat treatment temperature (° C.) | Mean distance between convex parts (μm) | Standard deviation from mean distance between convex parts (%) | Mean lower end width of convex part (μm) | Drive voltage (Vf) (V) | Light emission output (Po) (mW) |
|---|---|---|---|---|---|---|---|---|
| Experimental Example 11 | No concavo-convex | — | — | — | — | — | 3.3 | 9.3 |
| Experimental Example 12 | Au/Sn (Sn: 20 wt %) | 278 | 250 | 1.7 | 50 | 0.5 | 3.3 | 9.5 |
| Experimental Example 13 | Au/Sn (Sn: 20 wt %) | 278 | 350 | 0.8 | 85 | 0.5 | 3.3 | 9.1 |
| Experimental Example 14 | Au/Sn (Sn: 20 wt %) | 278 | 150 | 0.01 | 30 | <0.01 | 3.3 | 9.4 |

(Evaluation Results)

As shown in Tables 1 and 2, in the semiconductor light-emitting devices of Experimental Examples 1 to 10 in which the random concavo-convex surface was formed on the surface of the titanium oxide-based conductive film layer, the mean values of the center-to-center distances between the convex parts were within the range of 0.05 to 1.5 μm, and the standard deviations from the mean values of the center-to-center distances between the convex parts were within the range of 10% to 80%.

Moreover, in the semiconductor light-emitting devices of Experimental Examples 1 to 10, all of the light emission outputs (Po) were 12.4 m or more, and all of the drive voltages (Vf) were 3.3 V.

In the semiconductor light-emitting device of the Experimental Example 2, Ni was used as the material for the mask of the fine metal particles. The melting point of the metal of the fine metal particles was so high as 1455° C., and the heat treatment temperature during the mask formation was as high as 600° C. However, the standard deviation from the mean values of the distances between the convex parts was 55%.

In the semiconductor light-emitting device of Experimental Example 11 in which the concavo-convex pattern was not formed on the titanium oxide-based conductive film, the light emission output was 9.3 mW.

In the semiconductor light-emitting device shown in Experimental Example 12, the mean distance between the convex parts was 1.7 μm, which means that the convex parts were sparsely distributed, and the light emission output was 9.5 mW.

In the semiconductor light-emitting device shown in Experimental Example 13, the mean distance between the convex parts was 0.8 μm, and the standard deviation from this mean distance was 85%, which means that the distances between the convex parts varied widely. The light emission output was 9.1 mW.

In the semiconductor light-emitting device of Experimental Example 14, the mean distance between the convex parts was 0.01 μm, and the mean lower end width of the convex parts was 0.01 μm. The light emission output was 9.4 mW.

From the above results, it is apparent that the semiconductor light-emitting device of the present invention has excellent light extraction efficiency and high device characteristics.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor light-emitting device comprising an n-type semiconductor layer, a light-emitting layer, a p-type semiconductor layer, and a titanium oxide-based conductive film layer laminated in this order, wherein:
   a random concavo-convex surface is formed on at least a part of the surface of said titanium oxide-based conductive film layer.

2. The semiconductor light-emitting device according to claim 1, wherein the mean distance between convex parts on said random concavo-convex surface formed on the surface of said titanium oxide-based conductive film layer, which is defined as the center-to-center distance between the convex parts, is within a range of 0.01 µm to 3 µm.

3. The semiconductor light-emitting device according to claim 2, wherein the mean distance between convex parts on said random concavo-convex surface formed on the surface of said titanium oxide-based conductive film layer, which is defined as the center-to-center distance between the convex parts, is within a range of 0.05 µm to 1.5 µm.

4. The semiconductor light-emitting device according to claim 2, wherein the standard deviation of the center-to-center distance between the convex parts from the mean value of the center-to-center distance between the convex parts is within a range of 10% to 80%.

5. The semiconductor light-emitting device according to claim 1, wherein said titanium oxide-based conductive film layer is of an oxide comprising Ti and at least one element selected from the group consisting of Ta, Nb, V, Mo, W, and Sb.

6. The semiconductor light-emitting device according to claim 1, wherein the semiconductor light-emitting device is a nitride-based semiconductor light-emitting device.

7. The semiconductor light-emitting device according to claim 6, wherein said nitride-based semiconductor light-emitting device is a GaN-based semiconductor light-emitting device.

8. A lamp comprising the semiconductor light-emitting device according to claim 1.

9. The semiconductor light-emitting device according to claim 1, further comprising a photocatalytic reaction prevention layer disposed on at least a part of the random concavo-convex surface of the titanium oxide-based conductive film layer, either directly or via an intervening layer.

10. The semiconductor light-emitting device according to claim 9, wherein a top surface and lateral surfaces of the titanium oxide-based conductive film are covered by a photocatalytic reaction prevention layer.

11. The semiconductor light-emitting device according to claim 10, wherein the photocatalytic reaction prevention layer covers a peripheral area of a top surface of the p-type semiconductor layer.

12. The semiconductor light-emitting device according to claim 11, wherein the photocatalytic reaction prevention layer further covers lateral faces of each of the n-type semiconductor layer, the light-emitting layer and the p-type semiconductor layer.

13. The semiconductor light-emitting device according to claim 9, wherein a photocatalytic reaction prevention layer has a surface comprising a concavo-convex portion, which corresponds to a shape and a location of the random concavo-convex surface disposed on the surface of the underlying titanium oxide-based conductive film layer.

14. A method of manufacturing a semiconductor light-emitting device, comprising:
   a step (1) of laminating, on a substrate, an n-type semiconductor layer, a light-emitting layer, a p-type semiconductor layer, and a titanium oxide-based conductive film layer in this order;
   a step (2) of forming a mask made of fine metal particles on the surface of the titanium oxide-based conductive film layer; and
   a step (3) of etching the surface of the titanium oxide-based conductive film layer from above the mask, wherein
   said step (3) forms, by dry etching or wet etching, a concavo-convex surface on at least a part of the surface of the titanium oxide-based conductive film layer, and
   said semiconductor light-emitting device is the semiconductor light-emitting device according to claim 1.

15. The method of manufacturing a semiconductor light-emitting device according to claim 14, wherein said step (2) comprises a step of forming a metal thin film on the surface of the titanium oxide-based conductive film layer and a heat treatment step following the formation of the metal thin film.

16. The method of manufacturing a semiconductor light-emitting device according to claim 14, wherein said step (3) forms, by dry etching, a concavo-convex surface on at least a part of the surface of the titanium oxide-based conductive film layer.

17. The method of manufacturing a semiconductor light-emitting device according to claim 14, wherein said step (3) forms, by wet etching, a concavo-convex surface on at least a part of the surface of the titanium oxide-based conductive film layer.

18. The method of manufacturing a semiconductor light-emitting device according to claim 14, wherein the fine metal particles forming the mask are Ni or Ni alloy.

19. The method of manufacturing a semiconductor light-emitting device according to claim 14, wherein the fine metal particles forming the mask are a low melting point metal or a low melting point alloy having a melting point within a range of 100° C. to 450° C.

20. The method of manufacturing a semiconductor light-emitting device according to claim 14, wherein the fine metal particles forming the mask are a low melting point metal selected from the group consisting of Ni, Au, Sn, Ge, Pb, Sb, Bi, Cd, and In, or a low melting point alloy containing at least one low melting point metal selected from the group.

* * * * *